(12) United States Patent
Stoker et al.

(10) Patent No.: US 10,204,984 B1
(45) Date of Patent: Feb. 12, 2019

(54) METHODS, APPARATUS AND SYSTEM FOR FORMING INCREASED SURFACE REGIONS WITHIN EPI STRUCTURES FOR IMPROVED TRENCH SILICIDE

(71) Applicant: GLOBALFOUNDRIES INC., Grand Cayman (KY)

(72) Inventors: Matthew W. Stoker, Ballstown Lake, NY (US); Judson R. Holt, Ballston Lake, NY (US); Timothy J. McArdle, Ballston Lake, NY (US); Annie Lévesque, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/667,376

(22) Filed: Aug. 2, 2017

(51) Int. Cl.
| H01L 29/49 | (2006.01) |
| H01L 29/06 | (2006.01) |
| H01L 27/108 | (2006.01) |
| H01L 21/02 | (2006.01) |
| H01L 29/423 | (2006.01) |

(52) U.S. Cl.
CPC .... *H01L 29/0657* (2013.01); *H01L 21/02104* (2013.01); *H01L 27/10876* (2013.01); *H01L 27/10879* (2013.01); *H01L 29/4236* (2013.01); *H01L 29/4933* (2013.01)

(58) Field of Classification Search
CPC .................................................. H01L 27/10879
See application file for complete search history.

(56) References Cited

U.S. PATENT DOCUMENTS 9,812,453 B1 * 11/2017 Mulfinger ........... H01L 27/0924

* cited by examiner

*Primary Examiner* — Fernando L Toledo
*Assistant Examiner* — Valerie N Newton
(74) *Attorney, Agent, or Firm* — Williams Morgan, P.C.

(57) ABSTRACT

At least one method, apparatus and system disclosed herein involves forming increased surface regions within EPI structures. A fin on a semiconductor substrate is formed. On a top portion of the fin, an epitaxial (EPI) structure is formed. The EPI structure has a first EPI portion having a first material and a second EPI portion having a second material. The first and second EPI portions are separated by a first separation layer. A first cavity is formed within the EPI structure by removing a portion of the second material in the second portion. A first conductive material is deposited into the first cavity.

20 Claims, 11 Drawing Sheets

METHODS, APPARATUS AND SYSTEM FOR FORMING INCREASED SURFACE REGIONS WITHIN EPI STRUCTURES FOR IMPROVED TRENCH SILICIDE

BACKGROUND OF THE INVENTION

Field of the Invention

Generally, the present disclosure relates to the manufacture of sophisticated semiconductor devices, and more specifically, to various methods for providing increased EPI surface regions for improved trench silicide.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

Figure 1:
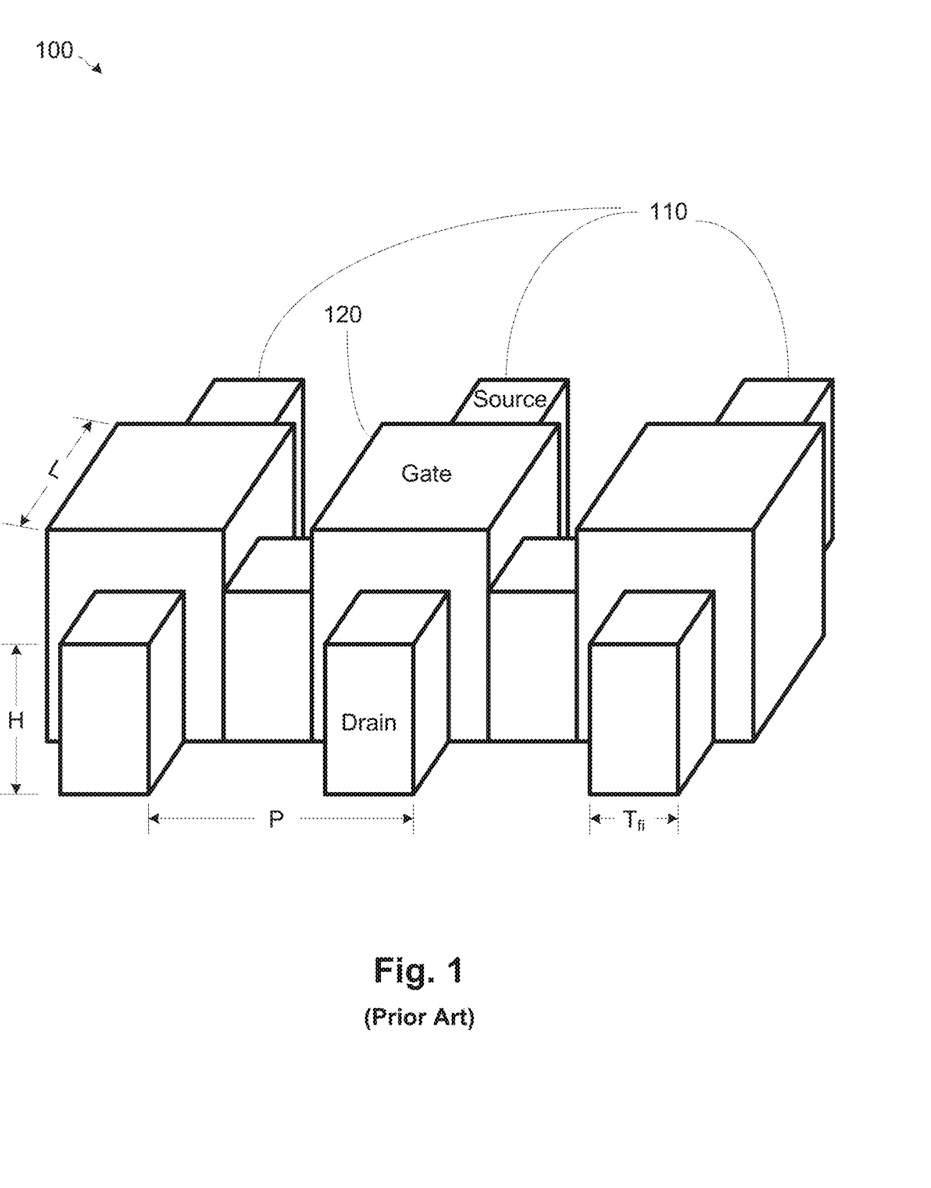
FIG. 1 illustrates a stylized cross-sectional depiction of a state-of-the-art finFET device.

FIG. 1 illustrates a stylized cross-sectional depiction of a state-of-the-art finFET device. A finFET device 100 illustrated in FIG. 1 comprises a plurality of "fins" 110. The semiconductor device may be position to a vertical orientation, creating one or more fins 110. The source and drain of the finFET are placed horizontally along the fin. A high-k metal gate 120 wraps over the fin, covering it on three sides. The gate 120 defines the length of the finFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

Figure 2:
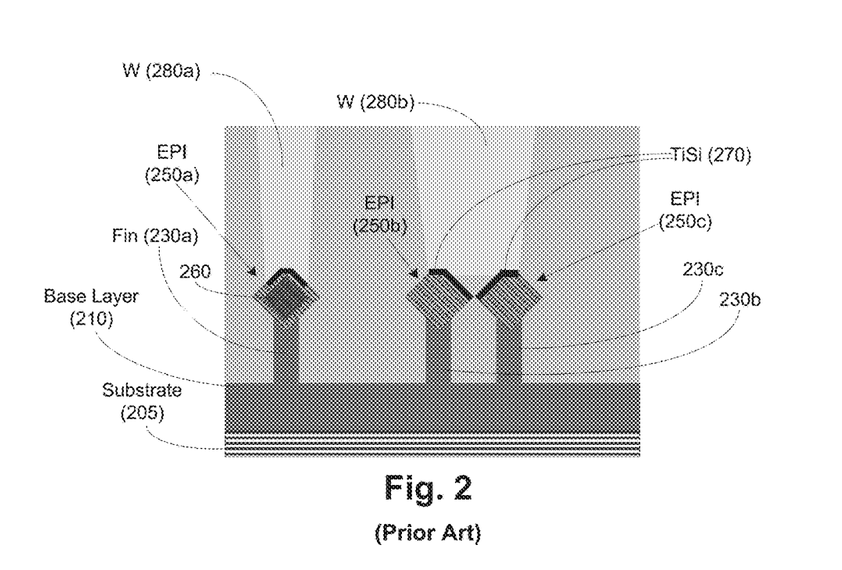
FIG. 2 illustrates a stylized cross-sectional depiction of the S/D fins in a typical finFET device.

The scaling down of integrated circuits coupled with higher performance requirements for these circuits have prompted an increased interest in finFETs. In order to increase performance with respect to source/drain (S/D) regions of a device, diamond-shaped epitaxial (EPI) features may be formed at the top of the fins in S/D regions. FIG. 2 illustrates a stylized cross-sectional depiction of the S/D fins in a typical finFET device. A device 200 comprises a substrate layer 205 (e.g., silicon substrate, silicon germanium substrate, etc.) on which a base layer 210 is formed. Using one of various techniques, a plurality of fins 230a, 230b, 230c (collectively "230") are formed on the base layer 210. Each of the fins 230 may be part of a fin structure, which may include the fin 230 and a plurality of layers of materials that may be deposited on the fins 230. The fin 230a is a PFET fin, while the fins 230b and 230c are NFET fins. The PFET fin 230a includes a P-doped SiGeB core 260, while the NFET fins 230b, 230c are comprised of an N-doped, SiP material.

FIG. 2 also shows a plurality of EPI features 250a, 250b, 250c (collectively "250") that are formed respectively on the fins 230a, 230b, 230c. The EPI features 250 provides for increased surface area for providing higher drive strength and lower contact resistance. In order to provide increased surface area for lowering contact resistance for the fins 230, a layer of TiSi 270 is formed over each of the EPI features 250. In order to form the TiSi 270 layers, a trench is formed over the fins 250 and a Ti layer is formed in the trench. After performing an annealing process and etching away unreacted Ti, the trench is filled with tungsten, forming a tungsten layer 280a above the EPI feature 250a, and a tungsten layer 280b of the EPI features 250b and 250c.

On occasion, the EPI feature on one fin (e.g., fin 250b) may inadvertently short to another EPI feature on an adjacent fin (e.g., 250c). In order to avoid this problem, designers have resorted to use narrower trenches. However, one of the problems associated with using narrower trenches to form narrower tungsten layers 280 is a reduction of the TiSi areas 270. The available surface area of the EPI layer 230 may be limited by surface area of the TiSi layer 270 above the EPI features 230. Further, contact etch variability may lead to an undesirable variability in contact resistance.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming increased surface regions within EPI structures. A fin on a semiconductor substrate is formed. On a top portion of the fin, an epitaxial (EPI) structure is formed. The EPI structure has a first EPI portion having a first material and a second EPI portion having a second material. The first and second EPI portions are separated by a first separation layer. A first cavity is formed within the EPI structure by removing a portion of the second material in the second portion. A first conductive material is deposited into the first cavity.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein for performing one or more process operations to form a greater amount of surface area in an EPI region of a fin in a finFET device. Embodiments herein call for forming a conductive thin film region (e.g., a $TiSi_2$ region inside an EPI structure, such as a diamond shaped EPI structure). In other embodiments, multiple conductive thin film region (e.g., $TiSi_2$ regions) may be formed within EPI structures, thereby providing additional surface area of conductive thin film. Utilizing embodiments herein, trench silicide (TS) regions are generally formed to conform to EPI regions; therefore, a TS region is less likely to be electrically shorted to an adjacent TS region. Further, the process of embodiments herein provide for TS regions that are generally void of containment of unwanted materials, such as silicide materials. The process according to embodiments herein also provide extracting the SiGe materials for providing void regions of controlled size and shape for silicide deposition.

Moreover, the increased conductive surface area formed within EPI region provided by embodiments herein may result in reduced NFET and PFET contact resistances. Utilizing embodiments herein, improved control of silicide size and shape may be provided.

Figure 3:
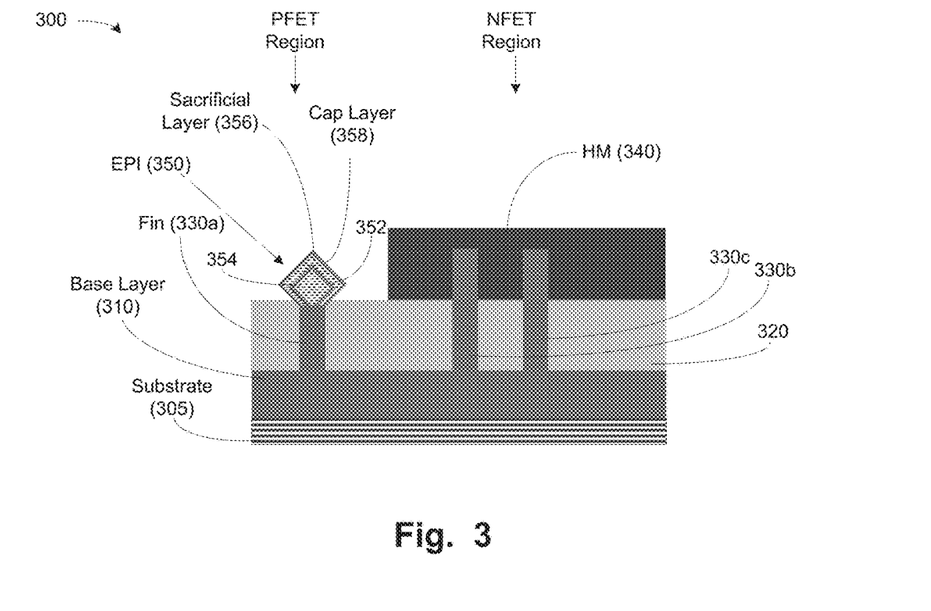
FIG. 3 illustrates a stylized depiction of a cross-section view of a finFET device, with respect to processing a PFET fin, in accordance with embodiments herein.

Turning now to FIG. 3, a stylized depiction of a cross-section view of a finFET device, with respect to processing a PFET fin, in accordance with embodiments herein is illustrated. FIG. 3 illustrates an integrated circuit device 300 comprising a plurality of fins 330a, 330b, 330c (collectively "330"), formed on a base layer 310 (e.g., $SiO_2$), which may be formed on a substrate 305 (e.g., silicon layer). In some embodiments, the base layer 310 and the substrate layer 305 may be a single layer. The fin 330a is a PFET fin, while the fins 330b, 330c are NFET fins. The device 300 comprises a PFET region, having PFET fins, and an NFET region having NFET fins.

Further, epitaxial features 350 may be formed on the top portions of the PFET fin 330a. A conventional EPI deposition/growth process may be performed to form a plurality of EPI features described herein. In some embodiments, the EPI features 350 may be formed in a diamond shape. In some cases, these diamond-shaped EPI features may be cladded, growing around and atop the existing fins 330. In other embodiments, the EPI features 350 may be embedded into the fins 330, wherein such embedding may be formed by etching away a portion of the fins 330 to form fin recesses, and forming EPI growth within the fin recesses. In some embodiment, the EPI features 350 may also provide dopants linking to, or even forming, the junction of the device 300.

Those skilled in the art having benefit of the present disclosure would appreciate that a plurality of process steps are performed to form the EPI feature 350, which correspond to source/drain (S/D) regions. In some embodiments, the EPI feature 350 may be grown to a size in the range of about 5 nm to about 70 nm (lateral EPI width). For example, in a 14 nm process, a lateral growth of about 50 nm for a diamond-shaped EPI feature 350 may be implemented. As another example, for a 7 nm process, a lateral growth of about 35 nm for a diamond-shaped EPI feature 350 may be implemented. The EPI feature 350 may be deposited using an ultra-high vacuum chemical vapor deposition process (CVD) process (UHVCVD). The precursors for the EPI features 350 may comprise gases comprising silicon (e.g., $SiH_4$, $Si_2H_2Cl_2$, $Si_2H_6$, $Si_3H_8$) and/or gases comprising germanium (e.g., $GeH_4$). The partial pressures of these gases may be varied to adjust the atomic ratio of germanium to silicon. In one embodiment, the EPI features 350 may be grown at a temperature of 700° C., and the temperature may be decreased to 550° C. with source gas. Other EPI features described in the present application may be formed in a similar manner.

The deposition of the bottom EPI features 350 may be performed as a plurality of deposition-etch cycles. Various process steps known to those skilled in the art may be performed with regard to forming the EPI features 350, including spacer RIE, EPI pre-clean processes, etc.

Embodiments herein provide for forming various structures within the EPI 350. During processing of the PFET region, a NFET hard mask 340 is formed to protect the NFET region from the processing steps performed on the PFET region. An inner EPI portion 354 is formed, e.g., in a diamond shape. The inner EPI portion 354 may be comprised of a P-doped material e.g., boron-doped silicon germanium layer, eSiGeB. Further, an etch stop feature 352 is formed, housing and protecting the inner EPI portion 354. In some embodiments, the etch stop feature may be comprised of Si. A sacrificial layer 356 may be formed over the etch stop feature 352. The sacrificial layer 356 may be comprised of SiGe, and is encompassed by a cap layer 358 (e.g., Si cap layer). The etch stop feature 352 acts as a separation layer between the inner EPI portion 354 and the sacrificial layer 356.

Figure 4:
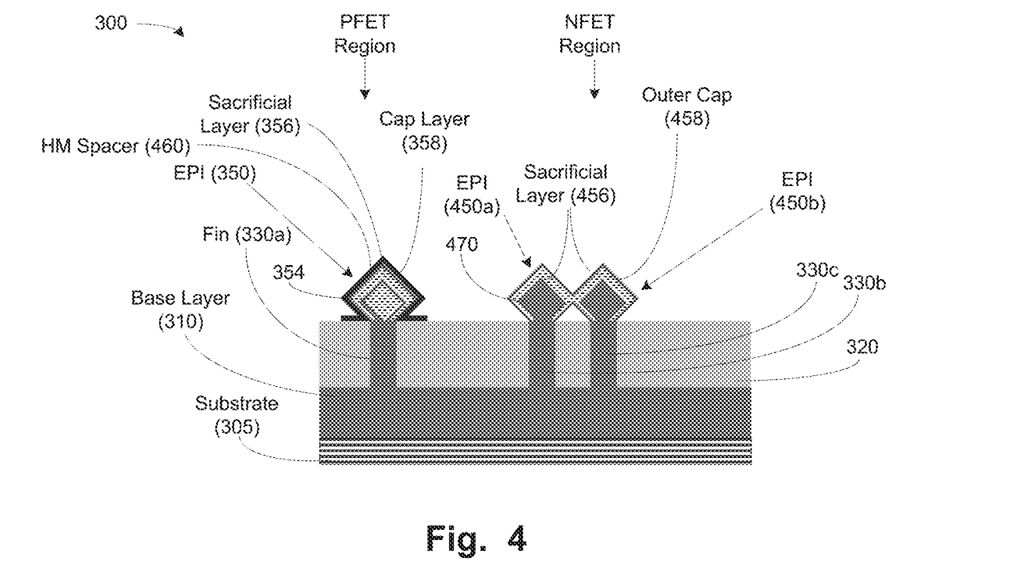
FIG. 4 illustrates a stylized depiction of a cross-section view of the finFET device of FIG. 3, with respect to processing NFET fins, in accordance with embodiments herein.

Turning now to FIG. 4, a stylized depiction of a cross-section view of the finFET device of FIG. 3, with respect to processing NFET fins, in accordance with embodiments herein is illustrated. FIG. 4 illustrates the integrated circuit device 300, comprising the fins 330a, 330b, 330c, formed on the base layer 310 above the substrate 305.

When processing steps are performed on the NFET fins (fins 330b and 330c), the PFET fin 330a is protected using a hard mask (HM) spacer layer 460. Further, the hard mask 340 of FIG. 3 over the PFET fins 330b, 330c, is removed for processing the PFET fins 330b, 330c. The HM layer 460 may be formed using nitride material(s), such as silicon nitride. With the HM layer 460 protecting the PFET fin 330a, processing steps on the NFET fins 330b are performed. An inner EPI diamond region 470 is formed at the top regions of the fins 330b, 330c. The inner EPI diamond regions 470 may be comprised of a P-doped silicon material, (e.g., SiP, SiCP) or the like.

Subsequently, a sacrificial layer 456 is formed over the inner EPI diamond regions 470. The sacrificial layer 456 may be comprised of silicon germanium (SiGe). Subsequently, an outer cap layer 458 may be formed over the inner sacrificial layer 456. The outer cap layer 458 may be comprised of a P-doped silicon material. Those skilled in the art having benefit of the present disclosure would appreciate that additional sacrificial layers and cap layers may be added to the EPI features 350, 450a, 450b, and remain within the spirit and scope of the embodiments herein. After the NFET fins 330b, 330c are processed, the HM spacer layer 460 is removed.

Figure 5:
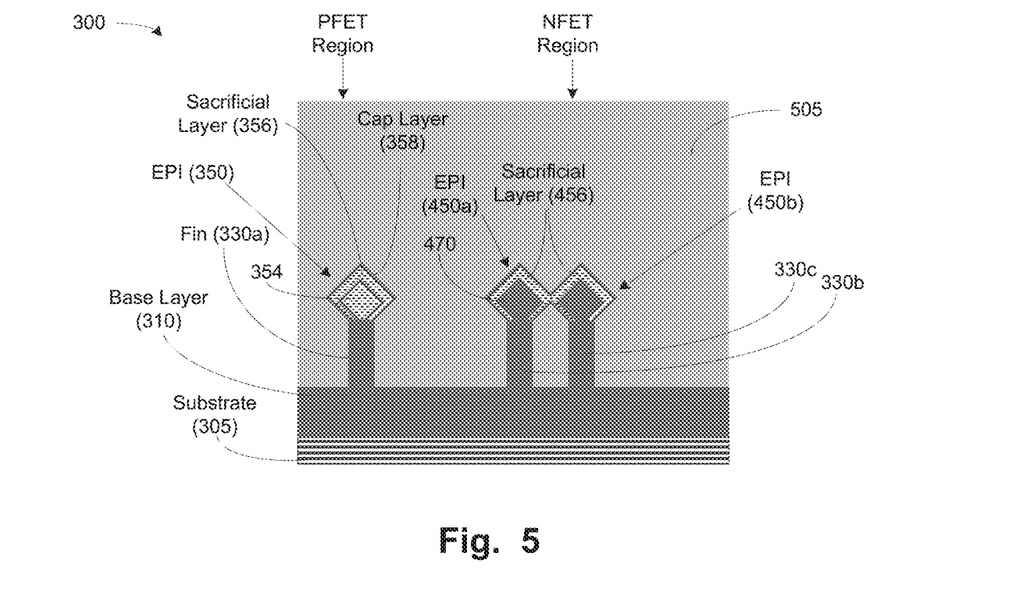
FIG. 5 illustrates a stylized cross-sectional view of the finFET device of FIG. 3, with respect to a dielectric layer formation process, in accordance with embodiments herein is illustrated.

Turning now to FIG. 5, a stylized cross-sectional view of the finFET device 300, with respect to an insulating layer formation process, in accordance with embodiments herein is illustrated. After forming the EPI formations 350, 450a,

450b, an additional layer 505 of SiO$_2$ or SiN$_2$ material is formed over the fins 330 and the EPI formations 350, 450a, 450b, in the manner shown in FIG. 5. In some embodiments, the EPI features 350 may be encapsulated with a relatively thin contact etch stop layer (CESL). The CESL may be comprised of silicon nitride. After deposition of the CELS, the deposition of the insulating layer 505 is performed.

Figure 6:
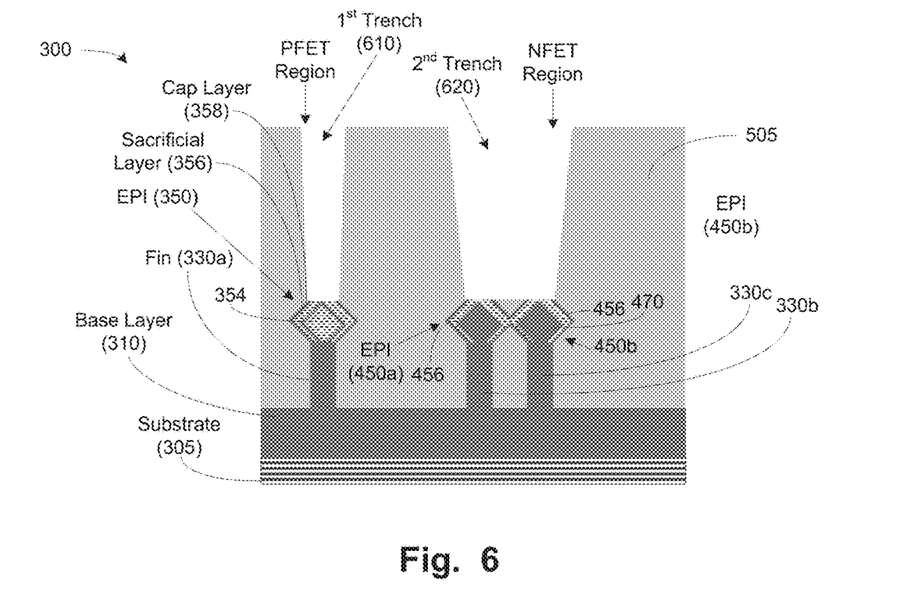
FIG. 6 illustrates a stylized cross-sectional view of the finFET device of FIG. 3, with respect to a trench formation process, in accordance with embodiments herein.

FIG. 6 illustrates a stylized cross-sectional view of the finFET device 300, with respect to a trench formation process, in accordance with embodiments herein. A first trench 610 may be formed over the PFET fin 330a. The first trench 610 partially infiltrates the EPI formation 350 such that a portion of the outer cap layer 358 is removed, exposing sacrificial layer 356. In some embodiment, a portion of the sacrificial layer 356 may also be removed.

A second trench 620 is formed over the NFET fins 330b, 330c. The second trench 620 partially infiltrates the EPI formations 450a, 450b such that portions of the outer cap layers 458 are removed, exposing sacrificial layers 456, wherein in some embodiments, a portion of the sacrificial layer 356 may also be removed. In one embodiment a timed etch process may be performed to form the trench to the desired depth. In other embodiments, an endpoint-to-sacrificial layer etch process may be performed such that the trenches 610, 620 are formed down to the sacrificial layers 356, 456 in the manner shown in FIG. 6.

Figure 7:
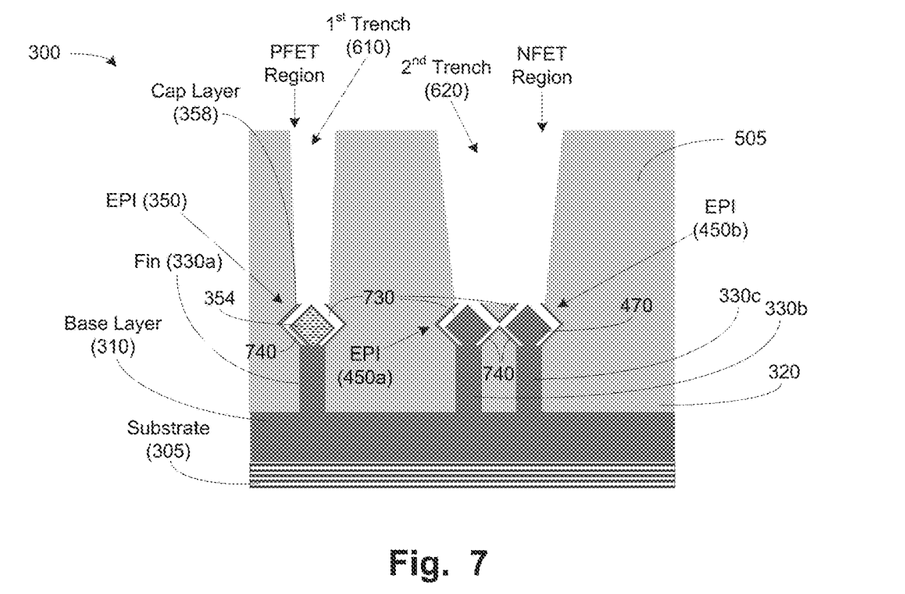
FIG. 7 illustrates a stylized cross-sectional view of the finFET device of FIG. 3, with respect to a sacrificial layer removal process, in accordance with embodiments herein.

FIG. 7 illustrates a stylized cross-sectional view of the finFET device 300, with respect to a sacrificial layer removal process, in accordance with embodiments herein. Upon gaining access to the inside portions of the EPI features 350, 450a, 450b as a result of the first and second trenches 610, 620, the sacrificial layers 356, 456 are removed. In some embodiments, the process for removing the sacrificial layers 356, 456 may be performed using a hot HCl or SC1 cleaning process. In some embodiments, a gaseous HCl etch process in a temperature range of about 350-600° C. may be performed for selectively etching the SiGe sacrificial layer, substantially without etching the Si etch stop layer 352 or the Si cap layer 358, 458.

Upon removing the sacrificial layers 356, 456, a cavity region remains in each of the EPI features 350, 450a, 450b. The cavity region comprises a top cavity region 730 located in the top regions of the EPI features 350, 450a, 450b, and a bottom cavity region 730 located at the bottom regions of the EPI features 350, 450a, 450b. In some embodiments, the top cavity regions 730 may be thicker in dimension that the bottom cavity regions 740.

Figure 8:
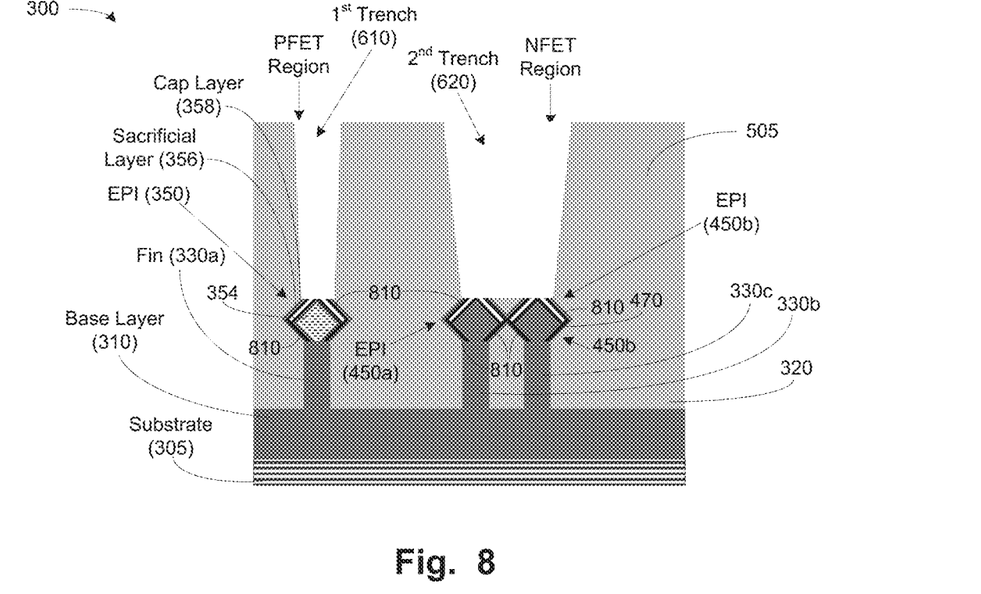
FIG. 8 illustrates a stylized cross-sectional view of the finFET device of FIG. 3, with respect to a conductive thin film deposition process, in accordance with embodiments herein.

FIG. 8 illustrates a stylized cross-sectional view of the finFET device 300, with respect to a conductive thin film deposition process, in accordance with embodiments herein. A conductive layer 810 may be formed within each of the cavity regions 730, 740. In many embodiments, the conductive layer 810 may be a conductive silicide layer. A plurality of process steps are performed for forming the conductive layers 810. These process steps includes deposition of a suitable silicide forming metal, e.g. Ti, Ni, W, Pt, Co, Mo, Ru, or Ta. The silicide forming metal may be deposited using a process steps that allows for substantially complete coverage within the narrow cavity regions 730, 740. Examples of these process steps may be a chemical-vapor deposition (CVD) process or an atomic layer deposition (ALD) process, which may provide substantially complete coverage by the conductive layer 810.

Subsequently, a silicide formation anneal process may be performed. After performing the silicide formation anneal process, an etch process (e.g., a wet etch process) may be performed for removing any excess unreacted or unetched metal or other unwanted process byproducts. In some embodiment, the conductive layer 810 may comprise silicide as well as residual, unreacted conductive metal.

In some embodiments, the conductive layer 810 may substantially fill the bottom cavity 740, as shown in FIG. 8. In some embodiments, the conductive layer 810 may line the walls of the top cavities 730, creating void regions in the top cavities 730. In other embodiment, the conductive layer 810 may substantially fill the top cavity 730, similar to the bottom cavity 740. In this manner, the top cavity 730 may provide additional conductive surface area within the EPI features 350, 450a, 450b. In other embodiments, the conductive layer 810 may substantially fill the top cavity 730, similar to the bottom cavity 740.

Figure 9:
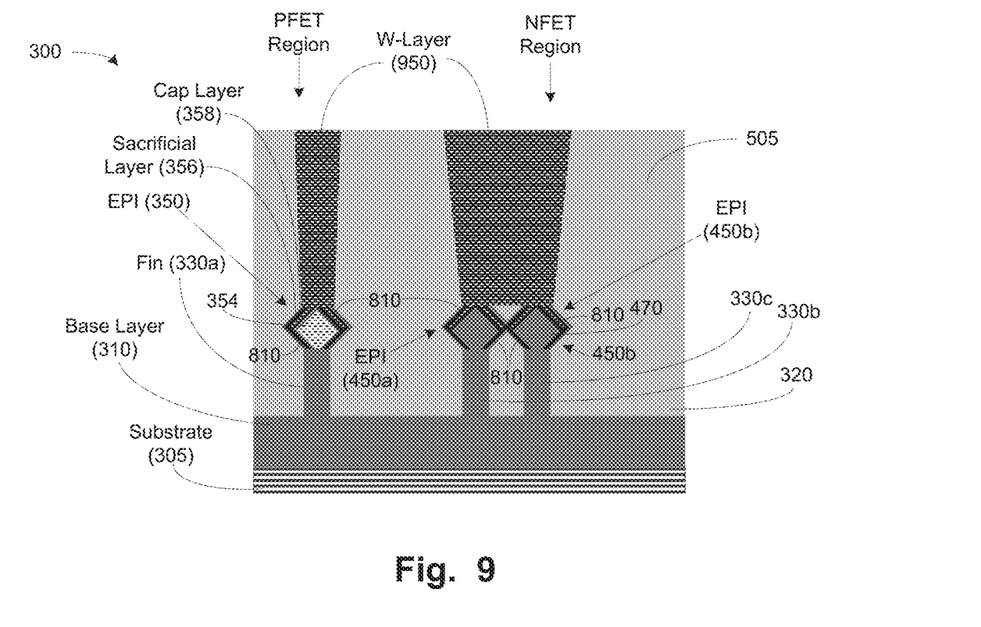
FIG. 9 illustrates a stylized cross-sectional view of the finFET device FIG. 3, with respect to a conductive material deposition process, in accordance with embodiments herein.

FIG. 9 illustrates a stylized cross-sectional view of the finFET device 300, with respect to a conductive material deposition process, in accordance with embodiments herein. After performing the conductive layer formation process, the trenches 610, 620 may be filled with a conductive material 950. In order to provide electrical contact with the conductive layer 810 (e.g., trench silicide), an additional metal layer (i.e., the conductive material 950) is provided in the trenches 610, 620.

In some embodiments, the conductive layer 950 may be comprised of tungsten. This process also causes the conductive material 950 to be deposited into the void regions in the top cavity 730. In this manner, EPI features having increased effective surface area may be provided, while maintaining the sizes of the EPI diamonds that avoid contact with other features of semiconductor devices. The processes according to embodiments herein also provide extracting the SiGe materials for providing a void of controlled size and shape for silicide deposition. In this manner, EPI features having increased effective surface area may be provided, while maintaining the sizes of the EPI diamonds that avoid contact with other features of semiconductor devices. This may provide various advantages, such as lower contact resistance, lower probability of TS to TS shorting, NFET and PFET contact resistance due to increase surface EPI surface area, and improved control of silicide size and shape. In some cases, embodiments herein may provide for improved effective capacitance ($C_{EFF}$) features.

Figure 10:
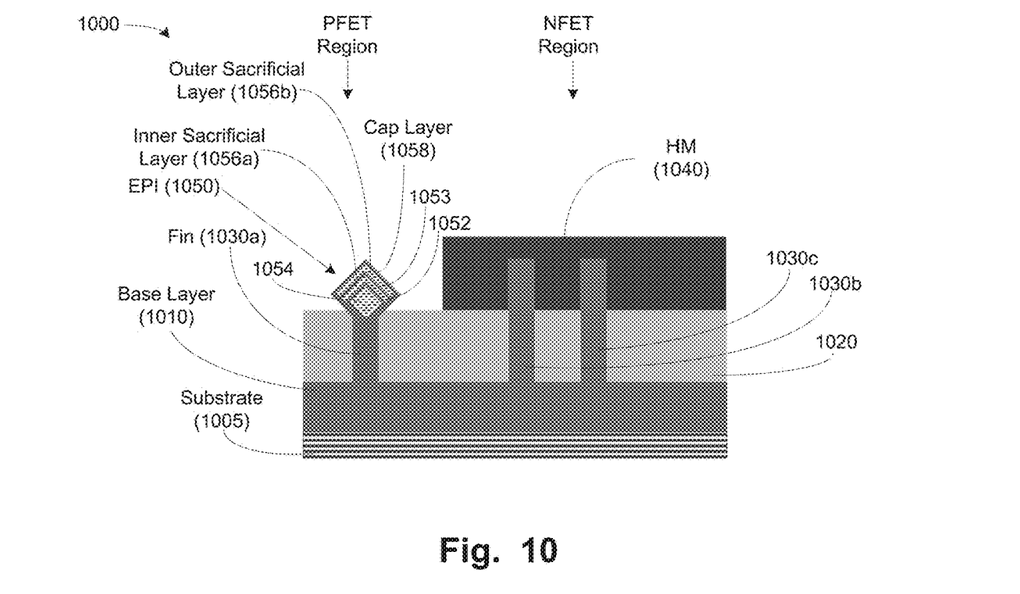
FIG. 10 illustrates a stylized depiction of a cross-section view of the finFET device of FIG. 4, with respect to processing NFET fins, in accordance with embodiments herein is illustrated.

Turning now to FIG. 10, a stylized depiction of a cross-section view of a finFET device, with respect to processing a PFET fin, in accordance with embodiments herein is illustrated. FIG. 10 illustrates an integrated circuit device 1000 comprising a plurality of fins 1030a, 1030b, 1030c (collectively "1030"), formed on a base layer 1010 (e.g., SiO$_2$), which may be formed on a substrate 1005 (e.g., silicon layer). In some embodiments, the base layer 1010 and the substrate layer 1005 may be a single layer. The fin 1030a is a PFET fin, while the fins 1030b, 1030c are NFET fins. The device 1000 comprises a PFET region having PFET fins, and an NFET region having NFET fins.

Further, an epitaxial feature 1050 may be formed on the top portion of the PFET fin 1030a, similar to forming the EPI features described above with respect to FIG. 3. Embodiments herein provide for forming various structures within the EPI feature 1050. During processing of the PFET region, a NFET hard mask 1040 is formed to protect the NFET region from the processing steps performed on the PFET region.

An inner etch stop feature 1052 is formed, housing an EPI material 1054 (e.g., boron doped silicon germanium layer, eSiGe-B). A plurality of sacrificial layers may be formed over the inner etch stop feature 1052. For example, an inner sacrificial layer 1056a may be formed over the feature 1052.

Subsequently, an outer etch stop layer 1053 may be formed over the inner sacrificial layer 1056a. Further, an outer sacrificial layer 1056b may be formed over the outer etch stop layer 1053. The outer sacrificial layer 1056b is encompassed by the cap layer 1058 (e.g., Si cap layer). Those skilled in the art having benefit of the present disclosure would appreciate that additional sacrificial layers may be formed for providing additional conductive surface regions within the EPI features described in FIGS. 10-16.

Figure 11:
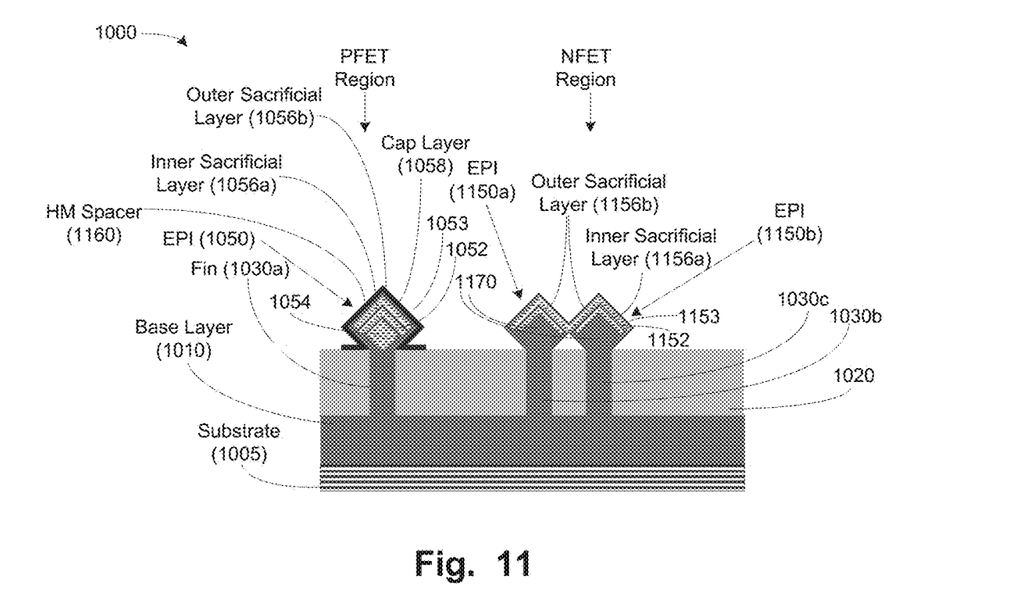
FIG. 11 illustrates a stylized depiction of a cross-section view of the finFET device of FIG. 10, with respect to processing NFET fins, in accordance with embodiments herein is illustrated.

Turning now to FIG. 11, a stylized depiction of a cross-section view of the finFET device of FIG. 10, with respect to processing NFET fins, in accordance with embodiments herein is illustrated. FIG. 11 illustrates the integrated circuit device 1000, comprising the fins 1030a, 1030b, 1030c, formed on the base layer 1010 above the substrate 1005.

When processing steps are performed on the NFET fins (fins 1030b and 1030c), the PFET fin 1030a is protected using a hard mask (HM) spacer layer 1160. Further, the hard mask 1040 of FIG. 10 over the PFET fins 1030b, 1030c, are removed for performing processing steps on the PFET fins 1030b, 1030c. The HM layer 1160 may be formed using nitride material(s), such as silicon nitride. With the HM layer 1160 protecting the PFET fin 1030a, processing steps on the NFET fins 1030b are performed.

An inner EPI diamond region 1170 is formed at the top regions of the fins 1030b, 1030c. The inner EPI diamond regions 1170 may be comprised of a P-doped silicon material, e.g., SiP material. Subsequently, an inner sacrificial layer 1156a is formed over the inner EPI diamond regions 1170. The inner sacrificial layer 1156a may be comprised of silicon germanium (SiGe). Subsequently, an inner cap layer 1152 may be formed over the inner sacrificial layer 1156a. The inner cap layer 1152 may be comprised of a P-doped silicon material. Further, an outer sacrificial layer 1156b may be formed above the inner cap layer 1152. The inner sacrificial layer 1156a is isolated from the outer sacrificial layer by the inner cap layer 1152. An outer cap layer 1153 may then be formed over the outer sacrificial layer 1156b. Those skilled in the art having benefit of the present disclosure would appreciate that additional sacrificial layers and cap layer may be added to the EPI features 1050, 1150a, 1150b, and remain within the spirit and scope of the embodiments herein. After the NFET fins 1030b, 1030c are processed, the HM spacer layer 1160 is removed.

Figure 12:
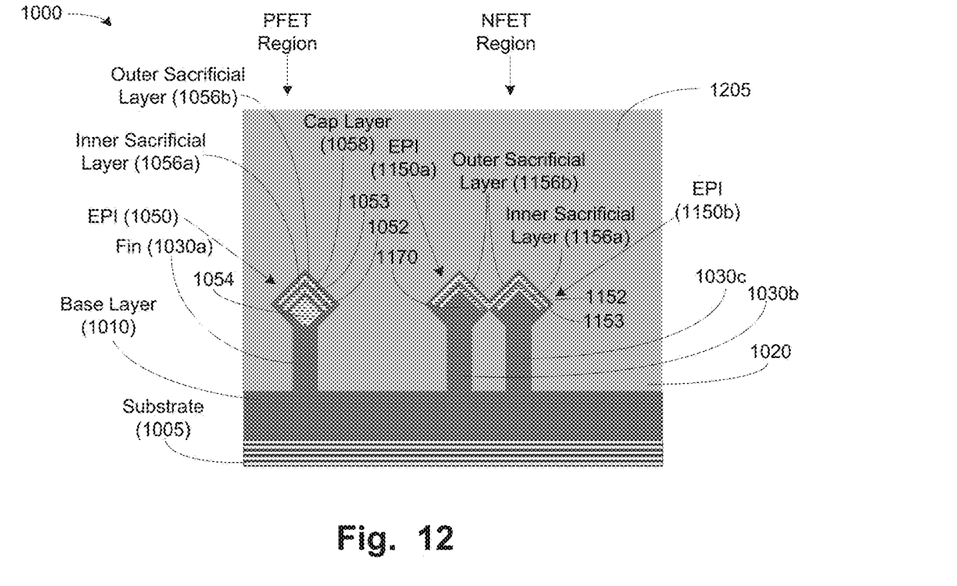
FIG. 12 illustrates a stylized cross-sectional view of the finFET device of FIG. 10, with respect to a dielectric layer formation process, in accordance with embodiments herein is illustrated.

Turning now to FIG. 12, a stylized cross-sectional view of the finFET device 1000, with respect to an insulating layer formation process, in accordance with embodiments herein is illustrated. After forming the EPI formations 1050, 1150a, 1150b, an additional layer 1205 of dielectric material (e.g., SiO$_2$ or SiN$_2$) material is added over the fins 1030 and the EPI formations 1050, 1150a, 1150b, in the manner shown in FIG. 12. In some embodiments, the EPI features 350 may be encapsulated with a relatively thin contact etch stop layer (CESL). The CESL may be comprised of silicon nitride. After deposition of the CELS, the deposition of the insulating layer 505 is performed.

Figure 13:
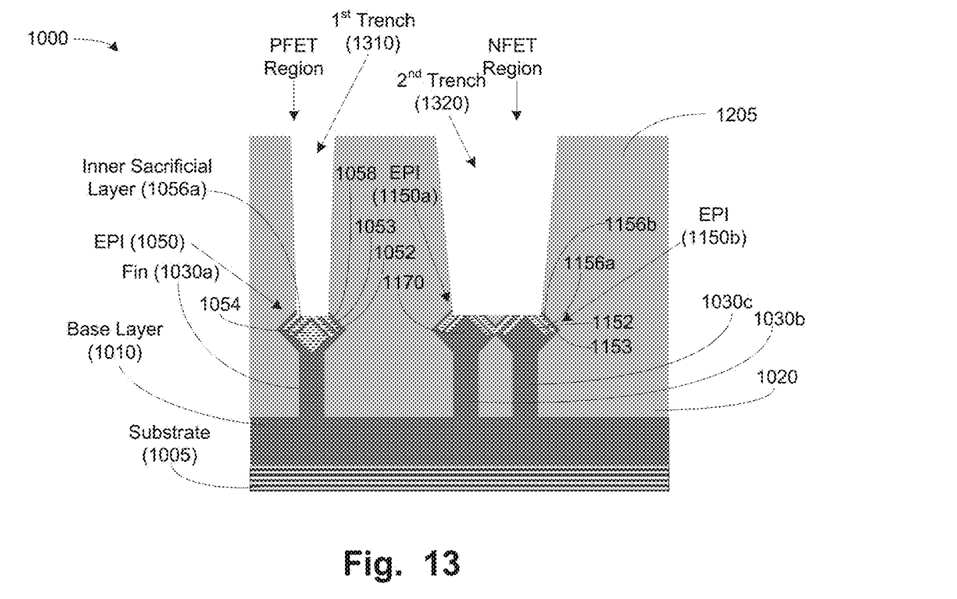
FIG. 13 is a stylized cross-sectional view of the finFET device of FIG. 10, with respect to a trench formation process, in accordance with embodiments herein.

FIG. 13 illustrates a stylized cross-sectional view of the finFET device 1000, with respect to a trench formation process, in accordance with embodiments herein. A first trench 1310 may be formed over the PFET fin 1030a. The first trench 1010 partially infiltrates the EPI formation 1050 such that portions of the inner and outer cap layers 1052, 1053 are removed, exposing portions the inner and outer sacrificial layer 1056a, 1056b. In some embodiments, a portion of the inner and outer sacrificial layer 1056a, 1056b may be removed during the first trench process.

A second trench 1320 is formed over the NFET fins 1030b, 1030c. The second trench 1320 partially infiltrates the EPI formations 1150a, 1150b such that portions of the inner and outer cap layers 1152, 1153 are removed, exposing sacrificial layers 1156. In some embodiments, a portion of the inner and outer sacrificial layer 1056a, 1056b may be removed during the second trench process. In one embodiment a timed etch process may be performed to form the trench to the desired dept. In other embodiments, an end-point-to-sacrificial layer etch process may be performed such that the trenches 1310, 1320 are formed down to the sacrificial layers 1056a, 1056b, 1156a, 1156b in the manner shown in FIG. 13.

Figure 14:
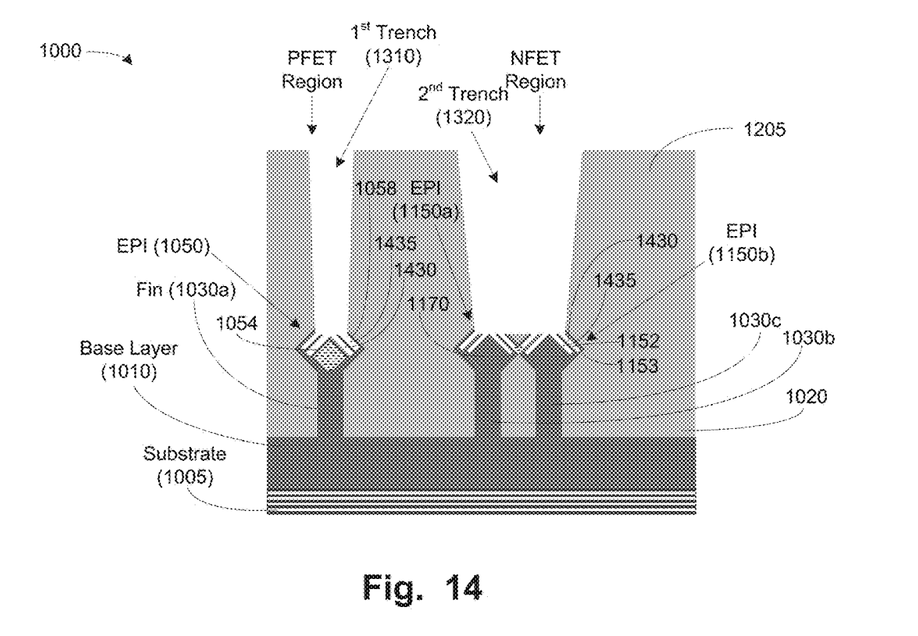
FIG. 14 illustrates a stylized cross-sectional view of the finFET device of FIG. 10, with respect to a sacrificial layer removal process, in accordance with embodiments herein.

FIG. 14 illustrates a stylized cross-sectional view of the finFET device 1000, with respect to a sacrificial layer removal process, in accordance with embodiments herein. By gaining access to the inside portions of the EPI features 1050, 1150a, 1150b as a result of the first and second trenches 1310, 1320, the sacrificial layers 1056a, 1056b, 1156a, 1156b are removed. In some embodiments, the process for removing the sacrificial layers 1056a, 1056b, 1156a, 1156b may be performed using a hot HCl or SC1 cleaning process. In some embodiments, a gaseous HCl etch process in a temperature range of about 350-600° C. may be performed for selectively etching the SiGe sacrificial layer, substantially without etching the Si etch stop layers 1052, 1053, or the Si cap layers 1152, 1153.

Upon removing the sacrificial layers 1056a, 1056b, 1156a, 1156b, a cavity region remains in each of the EPI features 1050, 1150a, 1150b. The cavity region comprises a top cavity 1430 located in the top regions of the EPI features 1050, 1150a, 1150b and an intermediate cavity 1435 located beneath the top cavity 1430. In alternative embodiments, a bottom cavity may be also formed in the bottom regions of the EPI features 1050, 1150a, 1150b, similar to FIG. 7.

Figure 15:
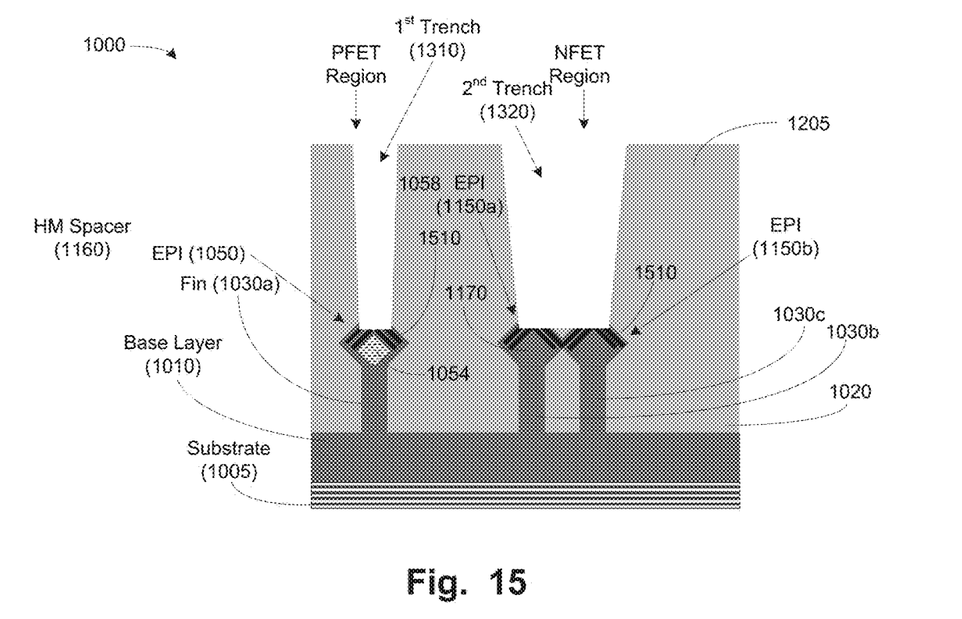
FIG. 15 illustrates a stylized cross-sectional view of the finFET device of FIG. 10, with respect to a conductive thin film deposition process, in accordance with embodiments herein.

FIG. 15 illustrates a stylized cross-sectional view of the finFET device 1000, with respect to a conductive thin film deposition process, in accordance with embodiments herein. A conductive layer 1510 may be formed within each of the cavity regions 1430, 1435. In many embodiments, the conductive layer 1510 may be a conductive silicide layer. A plurality of process steps are performed for forming the conductive layers 1510. These process steps includes deposition of a suitable silicide forming metal, e.g. Ti, Ni, W, Pt, Co, Mo, Ru, or Ta. The silicide forming metal may be deposited using a process steps that allows for substantially complete coverage within the narrow cavity regions 1430, 1435. Examples of these process steps may be a chemical-vapor deposition (CVD) process or an atomic layer deposition (ALD) process, which may provide substantially complete coverage by the conductive layer 810.

Subsequently, a silicide formation anneal process may be performed. After performing the silicide formation anneal process, an etch process (e.g., a wet etch process) may be performed for removing any excess residual metal or other unwanted byproducts. In some embodiment, the conductive layer 1510 may comprise silicide as well as residual, unreacted conductive metal.

In some embodiments, the conductive layer 1510 may substantially fill the top and intermediate cavities 1430, 1435, as shown in FIG. 15. In alternative embodiments, where a bottom cavity is present (similar to FIG. 7), the conductive layer 1510 may also fill the bottom cavity. In this manner, the top cavity 1430 may provide additional conductive surface area within the EPI features 1050, 1150a, 1150b.

Figure 16:
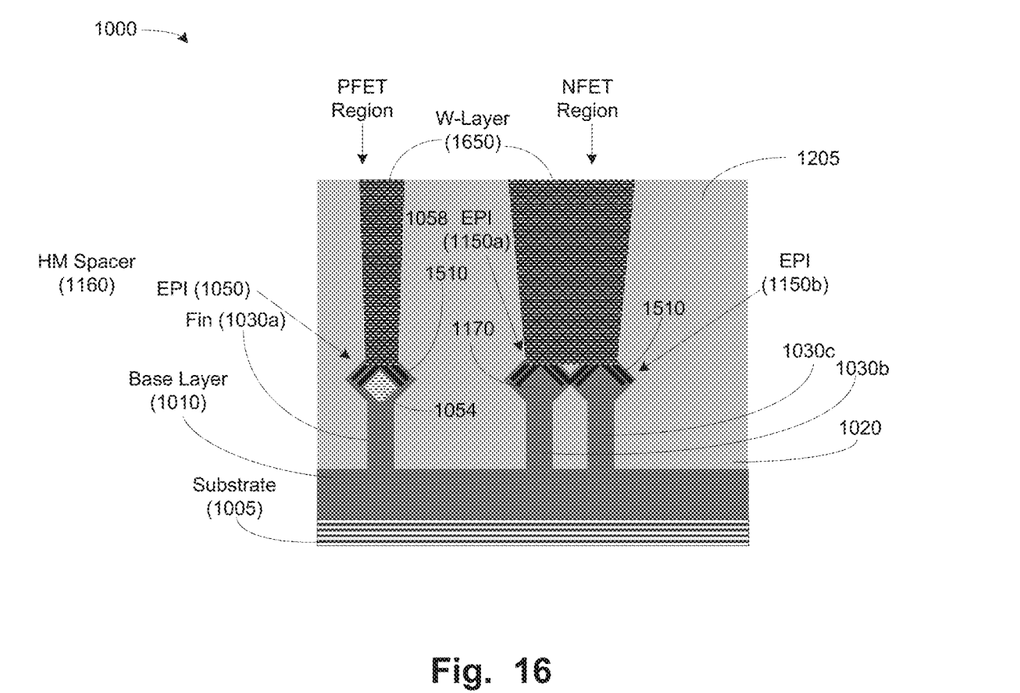
FIG. 16 illustrates a stylized cross-sectional view of the finFET device of FIG. 10, with respect to a conductive material deposition process, in accordance with embodiments herein.

FIG. 16 illustrates a stylized cross-sectional view of the finFET device 1000, with respect to a conductive material deposition process, in accordance with embodiments herein. After performing the conductive layer deposition process, the trenches 1310, 1320 may be filled with a conductive material 1650. In order to provide electrical contact with the conductive layer 1510 (e.g., trench silicide), an additional metal layer (i.e., the conductive material 1650) is provided in the trenches 610, 620.

In some embodiments, the conductive material may be comprised of tungsten. This process also causes the conductive material 1650 to be deposited into the void regions in the top and intermediate cavities 1430, 1430, and also in the bottom cavity in alternative embodiments. In this manner, EPI features having increased effective surface area may be provided, while maintaining the sizes of the EPI diamonds that avoid contact with other features of semiconductor devices. This may provide various advantages, such as lower contact resistance, lower probability of TS to TS shorting, NFET and PFET contact resistance due to increase surface EPI surface area, and improved control of silicide size and shape. In some cases, embodiments herein may provide for improved effective capacitance ($C_{EFF}$) features.

Figure 17:
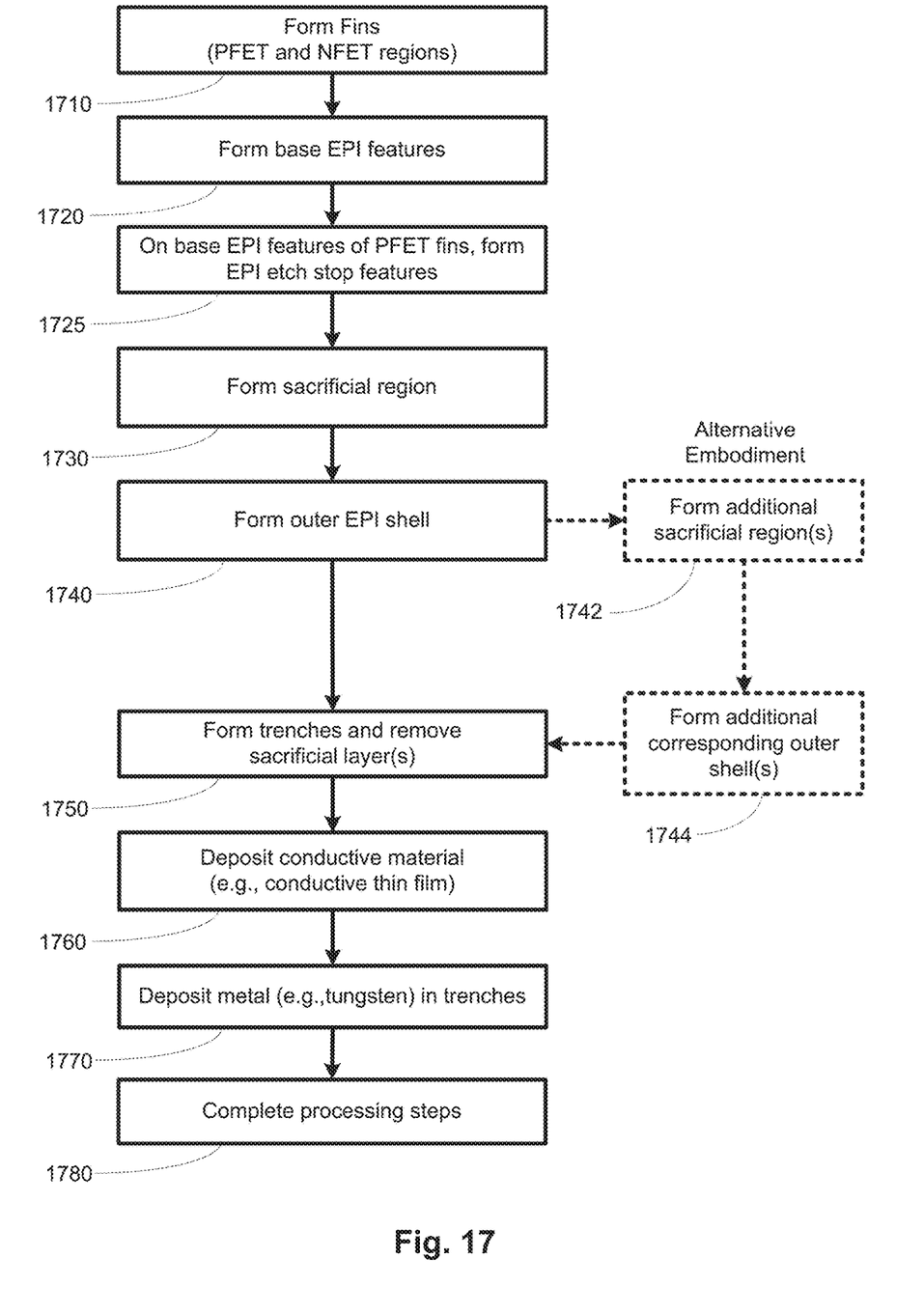
FIG. 17 illustrates a flowchart depiction of the method for processing an EPI feature for forming increased EPI surface, in accordance with embodiments herein is illustrated.

Turning now to FIG. 17, a flowchart depiction of the method for processing an EPI feature for forming increased EPI surface, in accordance with embodiments herein is illustrated. A plurality of fins are formed on a base layer over a substrate, including PFET and NFET fins (at 1710). Base EPI regions are formed on the fins (at 1720). EPI features are formed on NFET fins while the PFET regions are masked, and EPI features are formed on PFET regions while NFET regions are masked, see for example FIGS. 3 and 10. On base EPI features of PFET fins, an EPI etch stop feature is formed (at 1725).

A sacrificial layer is formed in each of the EPI features (at 1730). Subsequently, an outer EPI shell is formed (at 1740), see for example FIGS. 4 and 11. After depositing a dielectric layer over the fins and EPI feature, trench features are formed (at 1750), see for example, FIGS. 6 and 13. The trench features are sufficiently deep to access the inner portion of the EPI features such that the sacrificial layers are removed (at 1750) forming cavities in the EPI features, see for example, FIGS. 7 and 14.

In alternative embodiments, after forming a sacrificial region (at 1630), additional sacrificial regions may be formed (at 1742), see for example, FIG. 11. Subsequently, additional outer shells are formed over the additional sacrificial regions (at 1744).

After forming the TS regions and removing the sacrificial layers, a thin silicide-forming conductive material (e.g., Ti, Co, Ni, Pt, Ru, or the like) is added (at 1760) into the cavities formed as a result of removing the sacrificial regions, see for example, FIGS. 8 and 15. Subsequently, the trench is filled with a conductive material, e.g., tungsten (at 1770), see for example, FIGS. 9 and 16. In this manner, additional conductive surface area is provided within the EPI features. Subsequently, processing known to those skilled in the art may be performed to complete the processing the semiconductor device. Embodiments herein may provide various advantages, such as lower probability of TS to TS shorting, reduced NFET and PFET contact resistance due to increase surface EPI surface area, improved control of silicide size and shape, and improved $C_{EFF}$ features.

Figure 18:
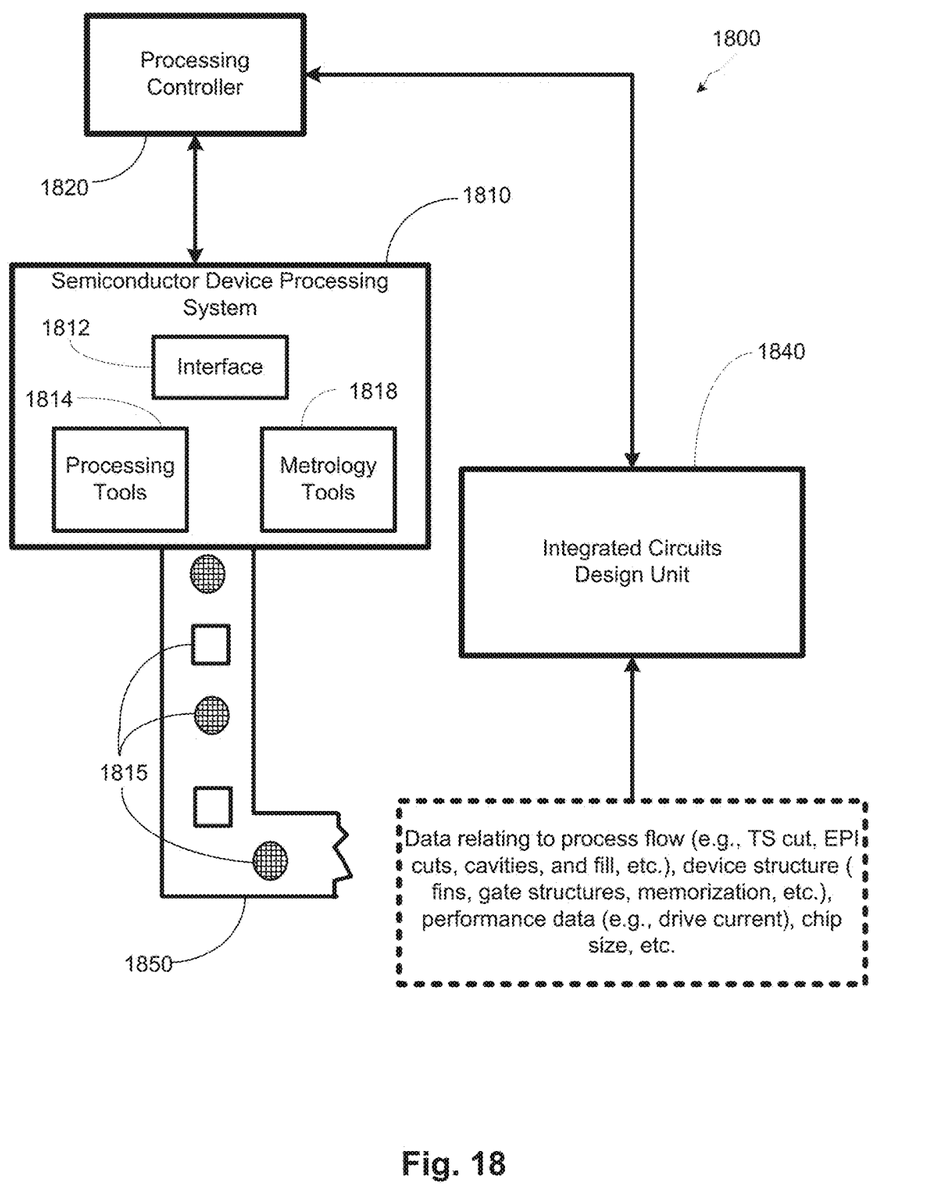
FIG. 18 illustrates a stylized depiction of a system for fabricating a semiconductor device comprising an integrated circuit, in accordance with embodiments herein.

Turning now to FIG. 18, a stylized depiction of a system for fabricating a semiconductor device comprising an integrated circuit, in accordance with embodiments herein, is illustrated. The system 1800 provides for forming cavities in EPI regions and depositing a conductive material for providing additional surface areas within the EPI regions. The system 1800 of FIG. 18 may comprise a semiconductor device processing system 1810 and a design unit 1840. The semiconductor device processing system 1810 may manufacture integrated circuit devices based upon one or more designs provided by the design unit 1840.

The semiconductor device processing system 1810 may comprise various processing stations, such as etch process stations, photolithography process stations, CMP process stations, Epitaxy (EPI) process stations, etc. One or more of the processing steps performed by the processing system 1810 may be controlled by the processing controller 1820. The processing controller 1820 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1810 may produce integrated circuits on a medium, such as silicon wafers. More particularly, the semiconductor device processing system 1810 produce integrated circuits having finFET devices that comprise fins that have channel voids filled with oxide and performed in a manner to reduce or substantially prevent oxidization, as described above.

The production of integrated circuits by the device processing system 1810 may be based upon the circuit designs provided by the integrated circuits design unit 1840. The processing system 1810 may provide processed integrated circuits/devices 1815 on a transport mechanism 1850, such as a conveyor system. In some embodiments, the conveyor system may be sophisticated clean room transport systems that are capable of transporting semiconductor wafers. In one embodiment, the semiconductor device processing system 1810 may comprise a plurality of processing steps to perform an early TS cut process for providing a more efficient process for forming TS features, as described above.

In some embodiments, the items labeled "1815" may represent individual wafers, and in other embodiments, the items 1815 may represent a group of semiconductor wafers, e.g., a "lot" of semiconductor wafers. The integrated circuit or device 1815 may be a transistor, a capacitor, a resistor, a memory cell, a processor, and/or the like.

The integrated circuit design unit 1840 of the system 1800 is capable of providing a circuit design that may be manufactured by the semiconductor processing system 1810. The integrated circuit design unit 1840 may be capable of determining the number of devices (e.g., processors, memory devices, etc.) to place in a device package, type of EPI features, EPI cuts, the number and type of cavities formed in the EPI features, the material to be deposited into the cavities, etc. The integrated circuit design unit 1840 may also determine the height of the fins, the size of the fin channels, etc. Based upon such details of the devices, the integrated circuit design unit 1840 may determine specifications of the finFETs that are to be manufactured. Based upon these specifications, the integrated circuit design unit 1840 may provide data for manufacturing a semiconductor device having the EPI features provided by embodiments herein.

The system 1800 may be capable of performing analysis and manufacturing of various products involving various technologies. For example, the system 1800 may design and manufacturing-data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a fin on a semiconductor substrate;
   forming, on a top portion of said fin, an epitaxial (EPI) structure having a first EPI portion having a first material and a second EPI portion having a second material, the first and second EPI portions being separated by a first separation layer;
   forming a first cavity within said EPI structure by removing a portion of the second material in said second portion; and
   depositing a first conductive material into said first cavity.

2. The method of claim 1, wherein:
   forming said fin comprises forming a PFET fin; and
   forming said EPI structure comprises:
      forming a P-doped structure at said first EPI portion;
      forming a separation layer over said P-doped structure;
      forming an SiGe structure at said second EPI portion; and
      forming a cap layer over said SiGe structure.

3. The method of claim 1, wherein:
   forming said fin comprises forming an NFET fin; and
   forming said EPI structure comprises:
      forming an N-doped structure at said first EPI portion;
      forming an SiGe structure at said second EPI portion; and
      forming a cap layer over said SiGe structure.

4. The method of claim 1, wherein forming said first cavity within said epitaxial structure comprises:
   forming a trench above said EPI structure, wherein said trench infiltrates a portion of the second EPI portion; and
   removing said second material from said second EPI portion to form said first cavity.

5. The method of claim 4, wherein removing said second material from said second EPI portion comprises performing at least one of an SC1 cleaning process, a wet HCl cleaning process, or a gaseous HCl etch.

6. The method of claim 4, wherein forming said first cavity comprises forming a void region in the second EPI portion wherein the void region substantially surrounds said first EPI portion.

7. The method of claim 4, further comprising depositing a silicide-forming material into said trench for forming a trench silicide region.

8. The method of claim 1, wherein depositing said first conductive material into said first cavity comprises:
   depositing a thin film silicide-forming material for lining at least a wall of said void region;
   performing a silicide formation anneal process; and
   etching at least one of residual metals and process byproducts.

9. The method of claim 1, wherein forming said EPI structure further comprises:
   forming a second separation layer above said second EPI portion;
   forming, above said second separation layer, a third EPI portion having said second material; and
   forming a cap layer above said third portion; and
   forming a second cavity within said EPI structure by removing a portion of the second material in said third EPI portion.

10. The method of claim 9, further comprising depositing said first conductive material into said second cavity.

11. A method, comprising:
   forming a plurality of fins on a substrate;
   forming an inner portion of an epitaxial (EPI) feature on each of said fins;
   forming a first sacrificial layer over said inner portion;
   forming a first cap layer encompassing said first sacrificial layer;
   forming a dielectric layer over said fins and said EPI features;
   forming a trench above said EPI features, wherein said trench encroaches said dielectric layer, a portion of the first cap layer, and a portion of said first sacrificial layer;
   removing said first sacrificial layer, creating a first cavity;
   depositing a first conductive material within said first cavity; and
   depositing a second conductive material into said trench.

12. The method of claim 11, wherein:
   forming a plurality of fins comprises forming a PFET fin;
   forming an inner portion of said EPI feature comprises forming a P-doped silicon layer encompassed by a silicon etch stop feature; and
   forming said first sacrificial layer comprises forming a SiGe layer above said silicon etch stop feature.

13. The method of claim 11, wherein
   forming a plurality of fins comprises forming a NFET fin;
   forming an inner portion of said EPI feature comprises forming an N-doped silicon layer; and
   forming said first sacrificial layer comprises forming a SiGe layer above said N-doped silicon layer.

14. The method of claim 11, wherein depositing said first conductive material within said first cavity comprises:
   depositing said first conductive material comprises depositing a silicide-forming material as a liner on the walls of said cavity, leaving a void space within said first cavity;
   performing a silicidation anneal process; and
   removing at least one of residual metals and byproducts.

15. The method of claim 11, further comprising:
   forming a second sacrificial layer over said first cap layer;
   forming a second cap layer encompassing said second sacrificial layer, wherein said trench further encroaches said second sacrificial layer;
   removing said second sacrificial layer, creating a second cavity; and
   depositing said first conductive material within said second cavity.

16. The method of claim 11, wherein:
   forming said inner portion of an epitaxial (EPI) feature comprises at least one of forming said inner portion of the EPI feature on a top portion of each fin, or forming the inner portion of the EPI structure into a cavity within a top portion of each fin; and depositing said first conductive material comprises depositing at least one of a Ti, Ni, W, Pt, Co, Mo, Ru, or Ta material, and depositing said second conductive layer comprises depositing a tungsten material.

17. A semiconductor device, comprising:
   a first fin;
   a first epitaxial (EPI) structure formed at a top region of said first fin, wherein said first EPI structure comprises an inner portion, and an outer cap layer formed at least partially over a first cavity that is formed between said inner portion and said outer cap, said first cavity comprising a first silicide-forming material; and
   a trench above said first EPI structure, wherein said trench is filled with a second conductive layer in electrical contact with the silicide resulting from a silicidation anneal of said first silicide-forming layer.

18. The semiconductor device of claim 17, wherein said first EPI structure further comprising a second cavity formed between said inner portion and said outer cap, said second cavity comprising said first conductive material.

19. The semiconductor device of claim 17, further comprising:
   a second fin; and
   a second EPI structure formed at a top region of said second fin, wherein said second EPI structure comprises an second inner portion, and a second outer cap layer at least partially over a third cavity formed between said inner portion and said outer cap, said third cavity comprising said first silicide-forming material; and
   wherein said trench extends over said first and second EPI structures, and wherein a portion of the first EPI is in contact with a portion of said second EPI.

20. The semiconductor device of claim 17, wherein said first silicide-forming material is formed along the walls of said first cavity, leaving a first void within said first cavity, wherein said first void comprises said second conductive material.

* * * * *